United States Patent
Huang et al.

(10) Patent No.: US 10,429,440 B2
(45) Date of Patent: Oct. 1, 2019

(54) DESIGN-FOR-TEST FOR ASYNCHRONOUS CIRCUIT ELEMENTS

(71) Applicants: Taiwan Semiconductor Manufacturing Co., Ltd., Hsinchu (TW); National Taiwan University, Taipei (TW)

(72) Inventors: Kuan-Yen Huang, Taipei (TW); Ting-Yu Shen, Taipei (TW); Chien-Mo Li, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 64 days.

(21) Appl. No.: 15/660,293

(22) Filed: Jul. 26, 2017

(65) Prior Publication Data

US 2019/0033366 A1     Jan. 31, 2019

(51) Int. Cl.
   *G01R 31/317*     (2006.01)
   *G01R 31/3177*    (2006.01)
   *G01R 31/3185*    (2006.01)

(52) U.S. Cl.
   CPC ... *G01R 31/31704* (2013.01); *G01R 31/3177* (2013.01); *G01R 31/318552* (2013.01); *G01R 31/318588* (2013.01); *G01R 31/31725* (2013.01)

(58) Field of Classification Search
   CPC .......... G01R 31/3177; G01R 31/31704; G01R 31/318541; G01R 31/318552; G01R 31/318583; G01R 31/318588
   See application file for complete search history.

(56) References Cited

U.S. PATENT DOCUMENTS

| | | | | |
|---|---|---|---|---|
| 2010/0185909 A1* | 7/2010 | Li | ................. | G01R 31/318541 714/726 |
| 2011/0191643 A1* | 8/2011 | Guo | ............... | G01R 31/318583 714/703 |
| 2013/0067292 A1* | 3/2013 | Tang | ............. | G01R 31/318552 714/727 |

(Continued)

OTHER PUBLICATIONS

Akopyan, Filipp et al., "TrueNorth: Design and Tool Flow of a 65 mW 1 Million Neuron Programmable Neurosynaptic Chip", IEEE Transactions on Computer-Aided Design of Integrated Circuits and Systems, vol. 34, No. 10, Oct. 2015, pp. 1537-1557.

(Continued)

*Primary Examiner* — Shelly A Chase
(74) *Attorney, Agent, or Firm* — Haynes and Boone, LLP

(57) ABSTRACT

Various examples of a circuit and a technique for testing the circuit are disclosed herein. In an example, the circuit includes a data input coupled to a scan multiplexer and a path select multiplexer. The circuit further includes a scan-in input coupled to the scan multiplexer and to receive a value of a scan pattern. The circuit further includes a scan latch to store the value that has an input coupled to the scan multiplexer and an output coupled to the path select multiplexer. The scan multiplexer selects a first signal from the data input and the scan-in input and provides the first signal to the input of the scan latch. The path select multiplexer selects a second signal from the data input and the output of the scan latch and provides the second signal to a data output of the circuit.

20 Claims, 8 Drawing Sheets

(56) References Cited

U.S. PATENT DOCUMENTS

2013/0103993 A1\* 4/2013 Ohtake .......... G01R 31/318541
714/720

OTHER PUBLICATIONS

Banerjee, Savita et al., "Synchronous Test Generation Model for Asynchronous Circuits", 9th International Conference on VLSI Design, Jan. 1996, pp. 178-185.

Te Beest, Frank et al., "Automatic Scan Insertion and Test Generation for Asynchronous Circuits", Proceedings of the International Test Conference, Paper 28.4, Oct. 10, 2002, pp. 804-813.

Van Berkel, Kees et al., "A Single-Rail Re-implementation of a DCC Error Detector Using a Generic Standard-Cell Library", IEEE Proceedings of the Second Working Conference on Asynchronous Design Methodologies, May 30-31, 1995, pp. 72-79.

Brzozowski, J. A. et al., "Testing C-Elements is Not Elementary", IEEE Proceedings of the Second Working Conference on Asynchronous Design Methodologies, May 30-31, 1995, pp. 150-159.

Efthymiou, Aristides, "Redundancy and Test-Pattern Generation for Asynchronous Quasi-Delay-Insensitive Combinational Circuits", IEEE Design and Diagnostics of Electronic Circuits and Systems, Apr. 11-13, 2007, 6 pages.

Fant, Karl M. et al., "NULL Convention LogicTM: A complete and consistent Logic for Asynchronous Digital Circuit Synthesis", Proceedings of the International Conference on Application Specific Systems, Architectures and Processors, Aug. 19-21, 1996, pp. 261-273.

Petlin, O. A. et al., "Scan Testing of Asynchronous Sequential Circuits", Proceedings of the 5th Great Lakes Symposium on VLSI, New York, Mar. 1995, pp. 224-229.

Hulgaard, Henrik et al., "Testing asynchronous circuits: A survey", Integration, the VLSI Journal, vol. 19, Issue 3, Nov. 1995, pp. 111-131.

Kang, Yong-Seok et al., "New Scan Design of Asynchronous Sequential Circuits", The First IEEE Asia Pacific Conference on ASICs, Seoul, South Korea, Aug. 23-25, 1999, pp. 355-358.

Kondratyev, Alex et al., "Testing of Asynchronous Designs by "Inappropriate" Means. Synchronous approach", Proceedings of the Eighth International Symposium on Asynchronous Circuits and Systems (ASYNC'02), Manchester, UK, Apr. 8-11, 2002, 10 pages.

Lines, Andrew Matthew, "Pipelined Asynchronous Circuits", California Institute of Technology, Technical Report, Pasadena, California, Jun. 1995, revised Jun. 1998, 37 pages.

Marr, Bo et al., "Scaling Energy Per Operation via an Asynchronous Pipeline", IEEE Transactions on Very Large Scale Integration (VLSI) Systems, vol. 21, No. 1, Jan. 2013, pp. 147-151.

Martin, Alain J., "The Limitations to Delay-Insensitivity in Asynchronous Circuits", Proceedings of the 6th MIT Conference on Advanced Research in VLSI, MIT Press, Nov. 1989, Revised Jan. 1990, 19 pages.

Moore, Simon et al., "Point to Point GALS Interconnect", Proceedings of the Eighth International Symposium on Asynchronous Circuits and Systems, Manchester, UK, Apr. 8-11, 2002, 7 pages.

Nowick, S. M., "Design of a low-latency asynchronous adder using speculative completion", IEE Proceedings—Computers and Digital Techniques, vol. 143, Issue 5, Sep. 1996, pp. 301-307.

Sparso, Jens et al., "Principles of Asynchronous Circuit Design—A Systems Perspective", Kluwer Academic Publishers, http://www.imm.dtu.dk/~jspa/contents-foreword-abstracts.pdf, Sep. 2001, 354 pages.

Sparso, Jens et al., "Design of delay insensitive circuits using multi-ring structures", IEEE European Design Automation Conference, EURO-VHDL'92, EURO-DAC'92, Hamburg, Germany, Sep. 7-10, 1992, pp. 15-20.

Wang, Ying-Hsu et al., "DFT and ATPG of Two-pattern Tests for Dual-rail Asynchronous Circuits", Master Thesis, National Taiwan University, Graduate Institute of Electronics Engineering, Sep. 2015, 76 pages.

\* cited by examiner

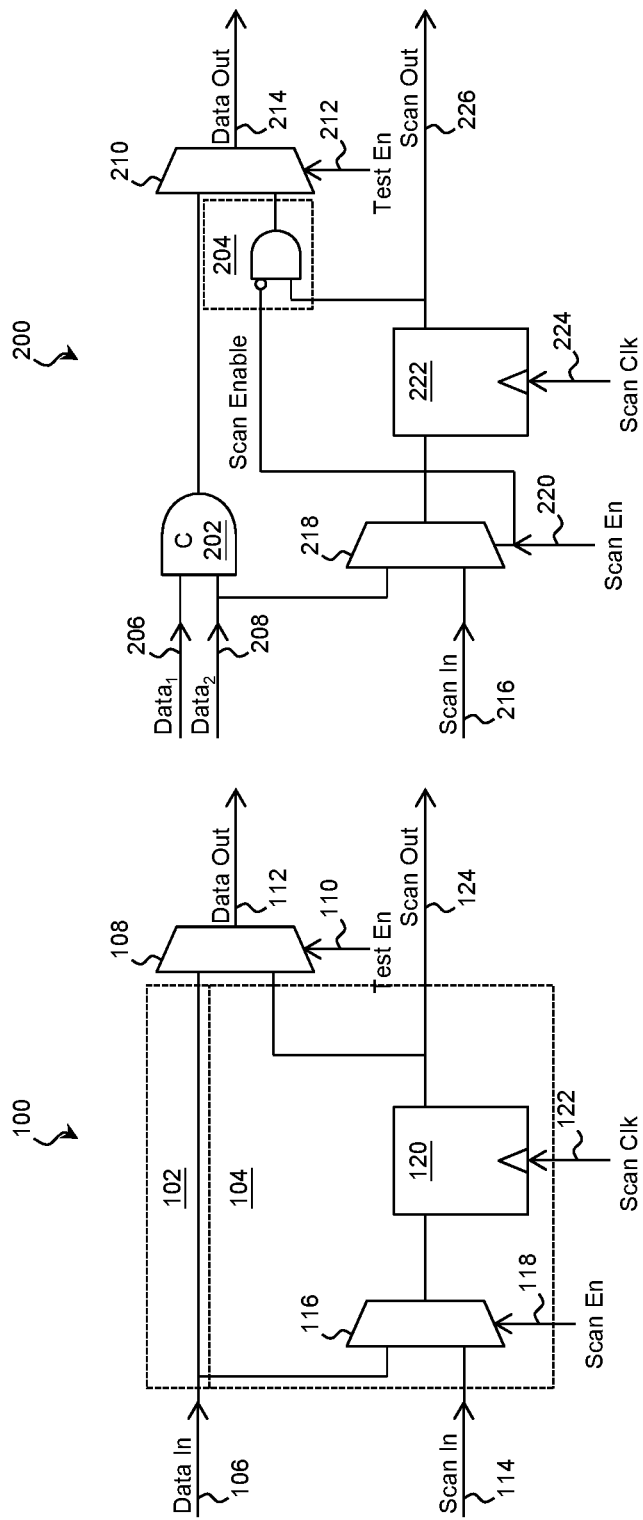

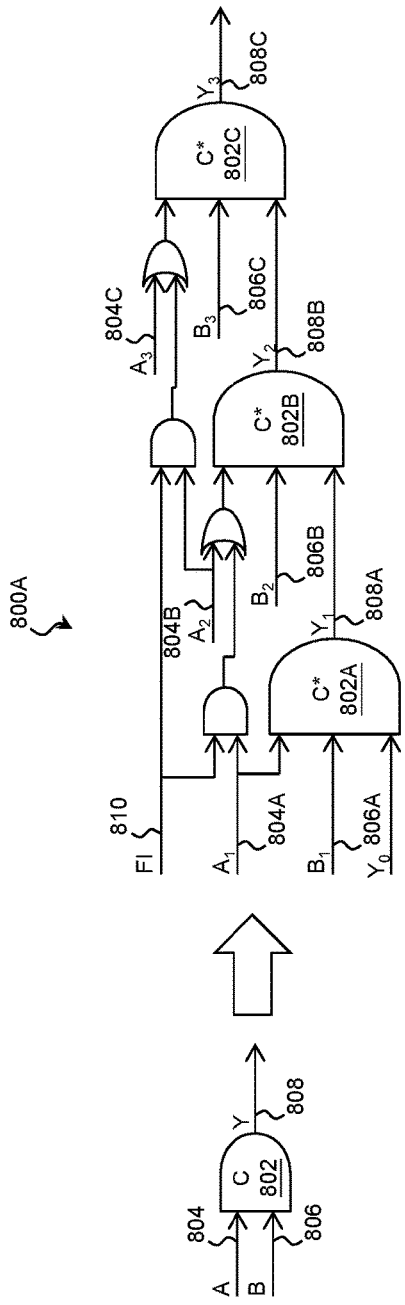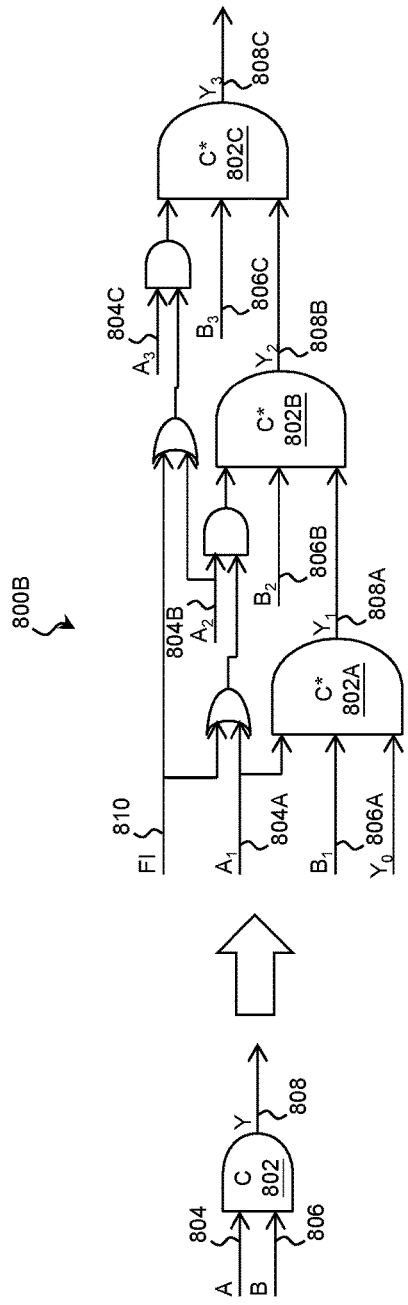
Fig. 8A
Fig. 8B

DESIGN-FOR-TEST FOR ASYNCHRONOUS CIRCUIT ELEMENTS

BACKGROUND

In synchronous circuits, memory elements, such as latches, capture data and change state according to a clock signal. Each memory element may receive a distinct copy of the clock signal, and properly synchronizing the elements may entail careful alignment of the edges of each clock signal copy. Clock drivers, buffers, repeaters, routing, and other clocking resources that distribute the signals are allocated a significant amount of the power and floorplanning budget because variations in the clock edges across memory elements affect performance. In an example, clock skew between a sending latch and a receiving latch affects the amount of time available for combinational logic between the latches, and excessive skew may cause the data to arrive at the receiving latch too late in the cycle to be accurately captured. In this way, the robustness of the clock tree may directly affect the maximum speed of a given circuit.

To meet the demands for faster computations, lower power, and smaller circuits, some designs use asynchronous circuits, where data is processed and captured independent of a clock. While portions of a circuit may have their own local clocks, data may be exchanged between portions independent of the local clock domains. Thus, a global clock and the associated clock distribution circuitry may be avoided. While some asynchronous designs may be more complex than their synchronous counterparts, the improved performance and potential lower power may justify the complexity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a schematic illustration of a circuit element according to various aspects of the present disclosure.

FIG. 2 is a schematic illustration of an asynchronous scannable element according to various aspects of the present disclosure.

FIG. 8A is a circuit diagram of a model of a scannable element for detecting a first type of slow-to-transition fault according to various aspects of the present disclosure.

FIG. 8B is a circuit diagram of a model of a scannable element for detecting a second type of slow-to-transition fault according to various aspects of the present disclosure.

DETAILED DESCRIPTION

Figure 3:
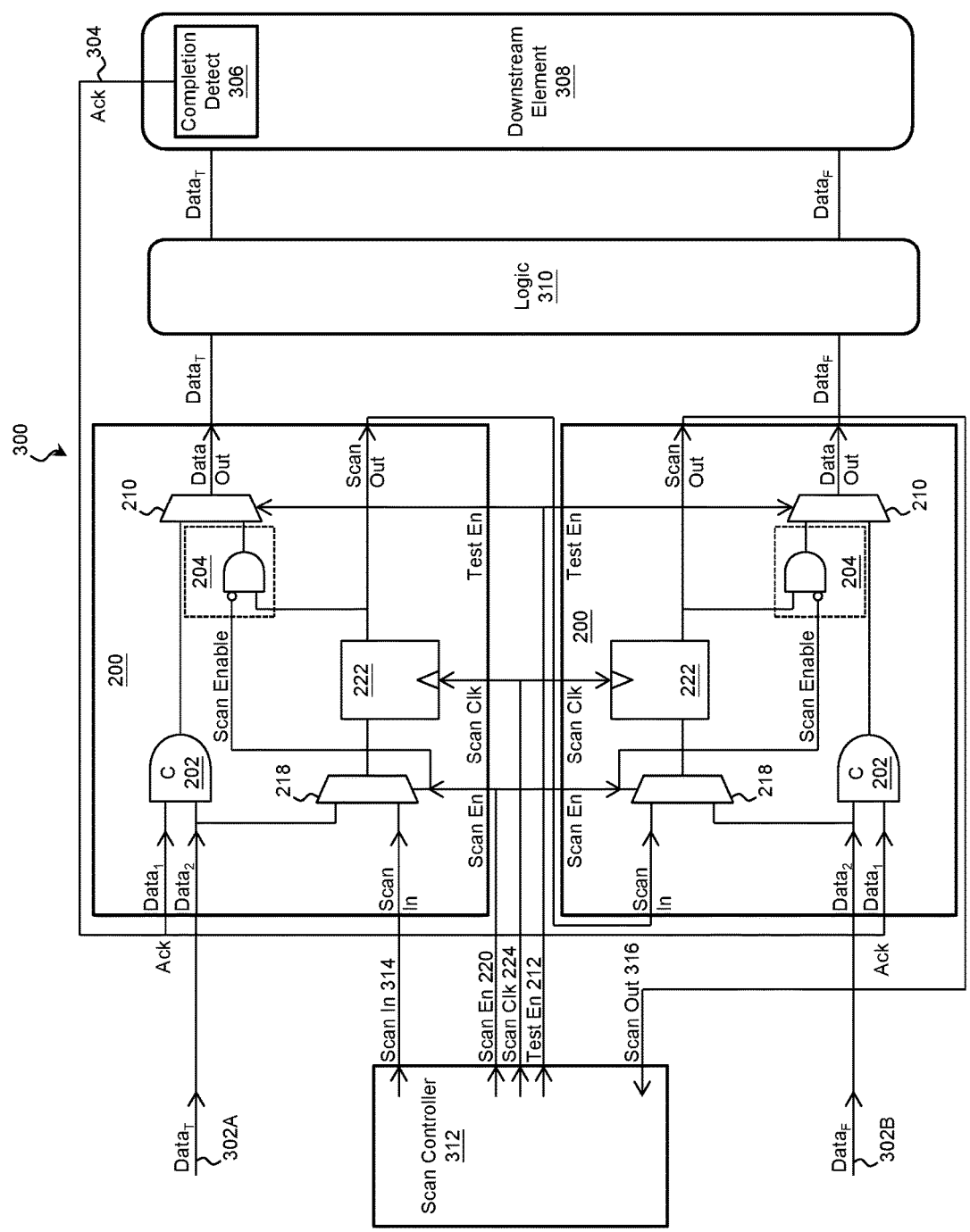
FIG. 3 is a schematic illustration of an asynchronous circuit according to various aspects of the present disclosure.

The present disclosure relates generally to testing of circuits, and more particularly, to circuits with Design-For-Test (DFT) elements and to methods for utilizing the elements to perform a scan test. In some examples, the DFT elements are incorporated into asynchronous circuits that use dual-rail data paths.

The following disclosure provides many different embodiments, or examples, for implementing different features of the disclosure. Specific examples of components and arrangements are described below to simplify the present disclosure. These are, of course, merely examples and are not intended to be limiting. For example, the arrangement of a first circuit element coupled to a second circuit element in the description that follows may include embodiments in which the first and second circuit elements are directly coupled, and may also include embodiments in which additional circuit elements are coupled between the first and second elements, such that the first and second circuit elements may not be in direct communication.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic illustration of a circuit element 100 according to various aspects of the present disclosure. The circuit element 100 includes Design-For-Test (DFT) features and includes a data path 102 and a scan path 104. During normal operation, the data path 102 allows data to flow through the circuit element 100, while the scan path 104 is used during testing to inject test values of a scan pattern into the circuit element 100. The scan path 104 may allow testing of the circuit element 100 itself and testing of other circuits to which it is coupled.

Turning first to the data path 102, the circuit element 100 may include a data input 106 that is coupled to a path select multiplexer 108. During normal operation, a test enable 110 causes the path select multiplexer 108 to couple the data input 106 to a data output 112 of the circuit element 100.

While the path select multiplexer 108 may be a synchronous multiplexer, in some examples, the path select multiplexer 108 is an asynchronous hazard-handling multiplexer. In more detail, some synchronous multiplexers may exhibit oscillations or other unintended transitions before finally settling on a value. In a synchronous environment, these hazards may not cause adverse effects if they resolve before the end of the clock cycle. However, in an asynchronous environment, unintended transitions may be mistaken for valid data. Accordingly, in an embodiment, the path select multiplexer 108 is an asynchronous hazard-handling multiplexer that is configured to transition directly to its final value without any intermediate transitions.

Turning next to the scan path 104, the circuit element 100 may include a scan-in input 114 to receive a scan pattern and inject the contained value(s) into the flow of data. In some embodiments, the scan-in input 114 is coupled to a scan path multiplexer 116. As with the path select multiplexer 108, the scan path multiplexer 116 may be a synchronous or asynchronous multiplexer. The scan path multiplexer 116 is controlled by a scan enable 118, which selects either the data input 106 or the scan-in input 114 to be provided to a scan latch 120.

The circuit element 100 may inject a value of a scan pattern into the data output 112 as part of a scan test. In some embodiments, at the beginning of such a test, the scan enable 118 is asserted to cause the scan path multiplexer 116 to provide the scan-in input 114 to the scan latch 120 to load the value of the scan pattern into the latch. The value is captured by the scan latch 120 when a scan clock 122 is pulsed. Multiple circuit elements 100 may be daisy chained in a scan chain (or scan ring) by coupling a scan-out output 124 of one circuit element 100 to the scan-in input 114 of a subsequent circuit element 100 in the chain. To load the scan pattern into the latches, the scan clock 122 is pulsed, and each pulse shifts the scan pattern through the chain until each scan latch 120 contains its respective value.

The output of the scan latch 120 may be coupled to the path select multiplexer 108, and once the values have been loaded, the test enable 110 is asserted to cause the path select multiplexer 108 to provide the value from the scan latch 120 to a downstream circuit element via the data output 112. During the test, the scan enable 118 may be de-asserted to cause the scan path multiplexer 116 to provide the data input 106 to the scan latch 120, rather than the scan-in input 114, to capture a response to the scan pattern when the scan clock 122 is pulsed. At the conclusion of the test, the scan latch 120 may provide the captured response via the scan-out output 124. In this way, the circuit element 100 provides a mechanism for injecting test values and for capturing the response to the test values.

FIG. 2 is a schematic illustration of an asynchronous scannable element 200 according to various aspects of the present disclosure. In the illustrated examples, the scannable element 200 includes a c-element 202 for storing data and a scan isolator 204 to initialize downstream logic by forcing a "0" state and to inhibit a scan latch 222 output from propagating downstream while the scan latch 222 is being loaded.

The c-element 202 is an example of an asynchronous data-storing circuit. In some examples, the c-element 202 changes state when the inputs have the same value, rather than in response to a clock. In the illustrated embodiments, the c-element 202 is coupled to a first input 206 and a second input 208 of the element 200. In some such embodiments, the c-element 202 outputs a logical "1" when both the first input 206 and the second input 208 are "1". Likewise, the c-element 202 outputs a logical "0" when both the first input 206 and the second input 208 are "0". When the first input 206 and the second input 208 are different, the c-element 202 output retains its current state via a feedback loop. In this way, the c-element 202 stores data without relying on a clock signal.

The output of the c-element 202 is coupled to a path select multiplexer 210, which may be a synchronous multiplexer or an asynchronous hazard-handling multiplexer. During normal operation, a test enable 212 causes the path select multiplexer 210 to provide the output of the c-element 202 to downstream circuits via a data output 214 of the element 200. In this way, the asynchronous scannable element 200 functions as a c-element 202 in the normal operation state.

The asynchronous scannable element 200 may also include a scan-in input 216 to receive a scan pattern and inject the contained value(s) into the flow of data. In some embodiments, the scan-in input 216 may be coupled to a scan path multiplexer 218. As with the path select multiplexer 210, the scan path multiplexer 218 may be a synchronous or asynchronous multiplexer. The scan path multiplexer 218 is controlled by a scan enable 220, which selects either a data input (e.g., the second input 208) or the scan-in input 216 to be provided to a scan latch 222.

The scan latch 222 may store a value of the scan pattern to inject into the flow of data via the path select multiplexer 210. In some embodiments, to prevent the value from being propagated prematurely, the scan latch 222 is coupled to the path select multiplexer 210 by a scan isolator 204. The scan isolator 204 initializes the downstream logic by forcing a "0" state. The scan isolator 204 also gates off the output of the scan latch 222 based on the scan enable 220 so that changes in the output of the scan latch 222 do not propagate to the data output 214 and cause an error in the downstream circuit elements while the scan pattern is being loaded.

In more detail, the circuit element asynchronous scannable element 200 receives a value of a scan pattern at the scan-in input 216 and the scan enable 220 signal causes the scan path multiplexer 218 to communicate the value from the scan-in input 216 to the scan latch 222. The value is captured by the scan latch 222 when a scan clock 224 is pulsed. Multiple elements 200 may be daisy chained in a scan chain by coupling a scan-out output 226 of one element 200 to the scan-in input 216 of a subsequent element in the chain. To load the scan pattern into the latches, the scan clock 224 is pulsed, and each pulse shifts the scan pattern through the chain until each scan latch 222 contains its respective value.

Once the values have been loaded, the scan enable 220 may be de-asserted to stop gating the output of the latch 220 in the scan isolator 204 and the test enable 212 may be asserted to cause the path select multiplexer 210 to provide the value from the scan latch 222 to a downstream circuit element via the data output 214. During the test, the scan enable 220 may be set to cause the scan path multiplexer 218 to provide the data input (e.g., the second input 208) to the scan latch 222, rather than the scan-in input 216, to capture a response to the scan pattern when the scan clock 224 is pulsed. At the conclusion of the test, the scan latch 222 may provide the captured response via the scan-out output 226. In this way, the element 200 provides a mechanism for injecting test values and for capturing the response to the test values.

Examples of a circuit incorporating the above elements are described with reference to FIG. 3. In that regard, FIG. 3 is a schematic illustration of an asynchronous circuit 300 according to various aspects of the present disclosure.

In some embodiments, the circuit 300 supports dual-rail signals, such as data signals 302A and 302B. Dual-rail encoding encodes a value using a pair of signals. A first signal of the pair (e.g., $Data_T$ signal 302A) is asserted to transmit a "1", while a second signal of the pair (e.g., $Data_F$ signal 302B) is asserted to transmit a "0". In other words, the first signal of the pair has a true polarity, and the second signal of the pair has an inverse polarity. When the signals in the pair are opposite each other, the signal with the true polarity represents the value.

Dual-rail encoding provides four distinct states. In an embodiment, a value of logical "1" may be represented by the $Data_T$ signal 302A having a state of "1" and the $Data_F$ signal 302B having a state of "0". Conversely, a value of logical "0" may be represented by the $Data_T$ signal 302A having a state of "0" and the $Data_F$ signal 302B having a state of "1". The remaining states where the signals of the pair are the same may be used to indicate other conditions. For example, a condition where valid data is not available (e.g., a pause between data bits, a bubble in a pipeline, or other condition) may be represented by the $Data_T$ signal 302A having a state of "0" and the $Data_F$ signal 302B having a state of "0". Accordingly, in some examples, the $Data_T$ signal 302A and the $Data_F$ signal 302B return to the (0,0) state between each value transmitted.

In the embodiments of FIG. 3, the circuit 300 receives dual-rail signal pair 302A and 302B, each of which are each coupled to a data input of an asynchronous scannable element 200 substantially as described above. A remaining data input of each of the asynchronous scannable elements 200 may be coupled to an Ack signal 304 that governs the flow of data through the asynchronous scannable element 200 and through the circuit 300. In more detail, the Ack signal 304 may be generated by completion detection logic 306 in a downstream circuit element 308. When asserted, the Ack signal 304 may indicate that processing of the data currently being provided by the asynchronous scannable elements 200 has been completed and that the data has been captured by the downstream circuit element 308. Thus, the Ack signal 304 may cause the asynchronous scannable elements 200 to provide the next set of data, when available.

In the illustrated examples, a first set of data is provided by the asynchronous scannable elements 200 and received by a set of logic 310 that performs any suitable combination of logical functions on the data. In the examples, the logic 310 provides the results of the first set of data to the downstream element 308, which captures the results. When the completion detection logic 306 determines that the results of the first set of data have been captured, the downstream circuit element 308 triggers the Ack signal 304 and thereby indicates that the asynchronous scannable elements 200 may provide a second set of data to the logic 310 when it is available at $Data_T$ signal 302A and $Data_F$ signal 302B.

For this purpose, each asynchronous scannable element 200 may include a c-element 202 that receives the Ack signal 304 and the respective signal of the dual-rail pair 302A and 302B. The c-element 202 is coupled to a path select multiplexer 210 that, during normal operation, provides the output of the c-element 202 to the logic 310 and, in turn, the downstream element 308.

In some embodiments, the circuit 300 includes DFT elements that allow values to be injected into the flow of data during a scan test. The scan test may be under the control of a scan controller 312 coupled to the asynchronous scannable elements 200. The scan controller 312 provides scan signals to the asynchronous scannable elements 200, such as a test signal 212, a scan enable 220, a scan-in signal 314, and a scan clock 224. The scan controller 312 may also receive a scan-out signal 316 from one or more of the asynchronous scannable elements 200.

Figure 4:
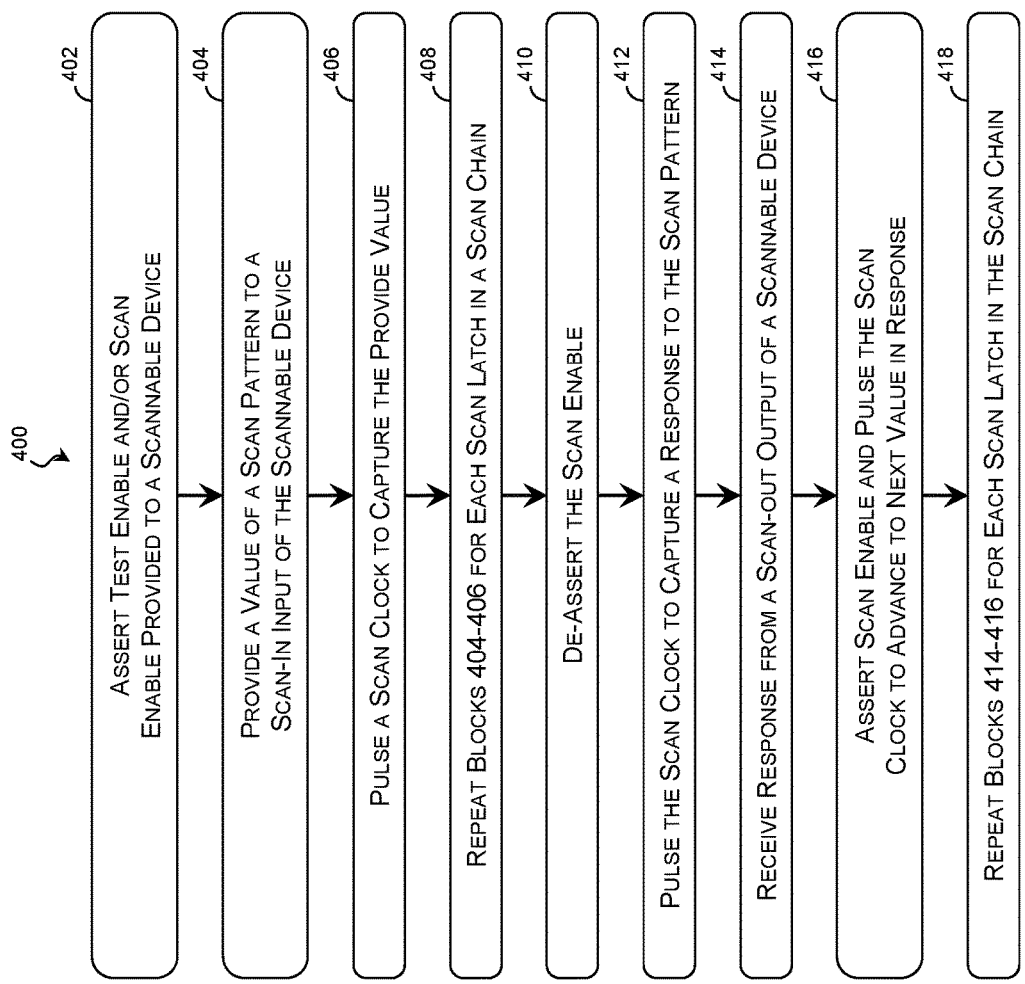
FIG. 4 is a flow diagram of method of performing a scan test according to various aspects of the present disclosure.

Examples of the scan controller 312 performing a scan test are described with reference to FIG. 3 and FIG. 4. In that regard, FIG. 4 is a flow diagram of method 400 of performing a scan test according to various aspects of the present disclosure. It is understood that additional steps can be provided before, during, and after the method 400 and that some of the steps described can be replaced or eliminated for other embodiments of the method 400.

Referring to FIG. 3 and to block 402 of FIG. 4, the scan controller 312 initiates the scan test by asserting the test enable 212 and/or the scan enable 220 provided to one or more scannable devices such as the asynchronous scannable elements 200. In some examples, the test enable 212 is asserted to cause a path select multiplexer 210 of an asynchronous scannable element 200 to inhibit the output of a c-element 202 in a data path of the scannable element 200 and to provide a scan value from a scan path at a data output instead. The scan enable 220, when asserted, may cause a scan path multiplexer 218 of the asynchronous scannable element 200 to provide a value received at a scan-in input to a scan latch 222 for storing, and may cause a scan isolator 204 to inhibit an output of the scan latch 222 from propagating downstream.

Referring to FIG. 3 and to block 404 of FIG. 4, the scan controller 312 provides a value of a scan pattern to a scannable device such as the asynchronous scannable element 200 via a scan-in signal 314. Referring to FIG. 3 and to block 406 of FIG. 4, the scan controller 312 pulses a scan clock 224 provided to the scannable device to capture the value provided in block 404 in a scan latch 222.

In some examples, multiple scannable devices are coupled in a scan chain by coupling a scan-out output of one device to the scan-in input of the next device in the chain. The scan-out output of the final device in the chain is fed back to the scan controller 312 via a scan-out signal 316. Daisy-chaining devices may greatly reduce the number of scan signals provided by the scan controller 312, which may reduce the number of drivers, routing tracks, and other resources used to provide the scan functionality. In some such examples, values are loaded in the scan latches 222 of the chained devices serially by repeating blocks 404 and 406 as indicated by block 408. Each pulse of the scan clock 224 in block 406 shifts the values of the scan pattern through the scan chain until each scan latch 222 contains the appropriate value.

Referring to FIG. 3 and to block 410 of FIG. 4, the scan controller 312 de-asserts the scan enable 220. This may have the effect of launching the scan test. For example, de-asserting may cause the scan isolator 204 to pass the output of the scan latch 222 to the data output of the scannable element 200. At this point, the test is initiated, and the logic 310 coupled between the asynchronous scannable elements 200 and the downstream element 308 begins operation on the values stored in the scan latches 222 rather than the values propagated by the data paths. De-asserting the scan enable 220 may also cause the scan path multiplexer 218 of the asynchronous scannable element 200 to couple a data input to the scan latch 222 for storing a response to the values.

Referring to FIG. 3 and to block 412 of FIG. 4, the scan controller 312 pulses the scan clock 224 to capture the values that represent the response to the scan pattern. To read the values, the scan controller 312 receives the values from the scan-out output of one or more of the scannable devices via a scan-out signal 316 as indicated in block 414. In examples where multiple scannable devices are coupled in a scan chain, the scan controller 312 asserts the scan enable 220 and pulses the scan clock 224 to shift the values stored in the scan latches 222 of the scan chain as shown in block 416. As shown in block 418, blocks 414 and block 416 may be repeated until each value is read from the devices of the scan chain.

A technique for generating a scan pattern for testing the circuit elements of the present disclosure is described with reference to FIG. 5 and FIGS. 6A and 6B. The scannable circuit element 100, the asynchronous scannable element 200, and the asynchronous circuit 300 of FIGS. 1-4 are operable to perform scan tests to detect a number of different types of faults. For example, in some embodiments, the above circuit elements test for a signal that is stuck at a value of "1" due to a short or other manufacturing defect by using a particular scan pattern that detects a transition or lack thereof indicating the stuck condition. Likewise, in some embodiments, the circuit elements perform a scan test with a different scan pattern to detect when the signal is stuck at "0".

Figure 5:
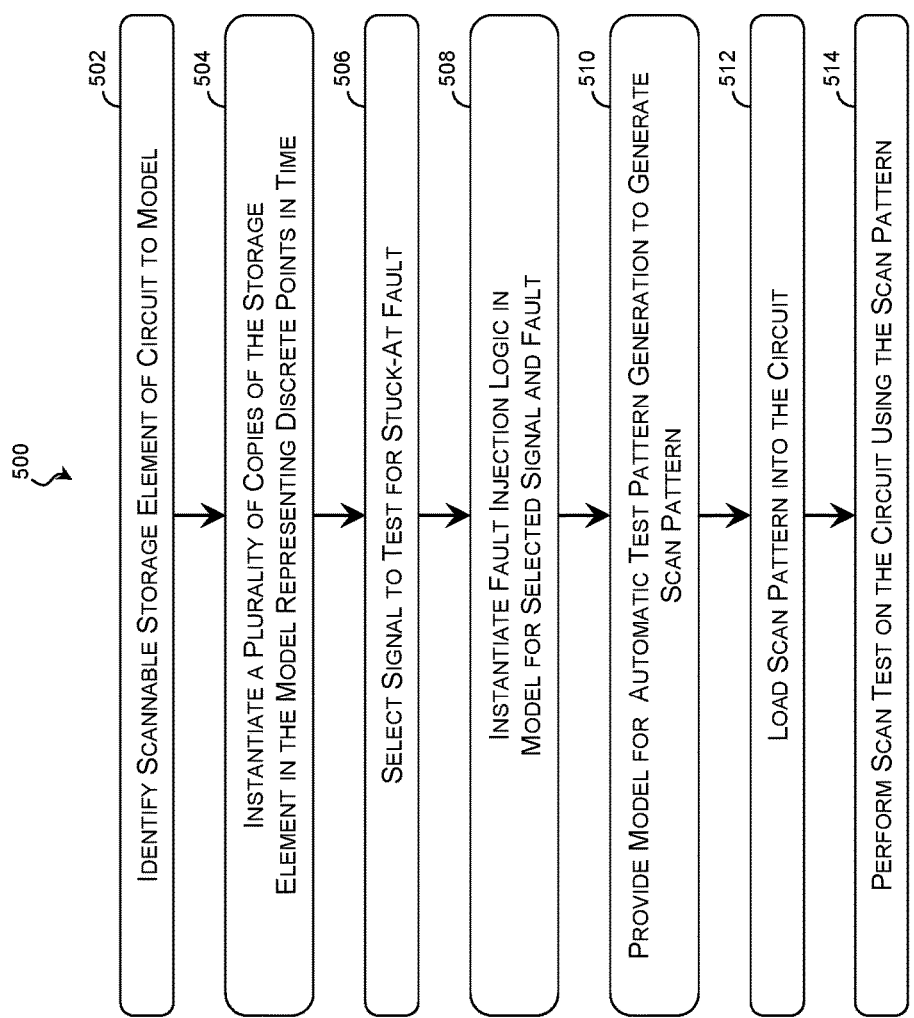
FIG. 5 is a flow diagram of a method of scan pattern generation for detecting stuck-at faults according to various aspects of the present disclosure.

FIG. 5 is a flow diagram of a method 500 of scan pattern generation for detecting stuck-at faults according to various aspects of the present disclosure. Additional steps can be provided before, during, and after the method 500, and some of the steps described can be replaced or eliminated for other embodiments of the method 500. FIG. 6A is a circuit diagram of a model 600A of a scannable element for detecting a first type of stuck-at fault according to various aspects of the present disclosure. FIG. 6B is a circuit diagram of a model 600B of a scannable element for detecting a second type of stuck-at fault according to various aspects of the present disclosure.

Figure 6A:
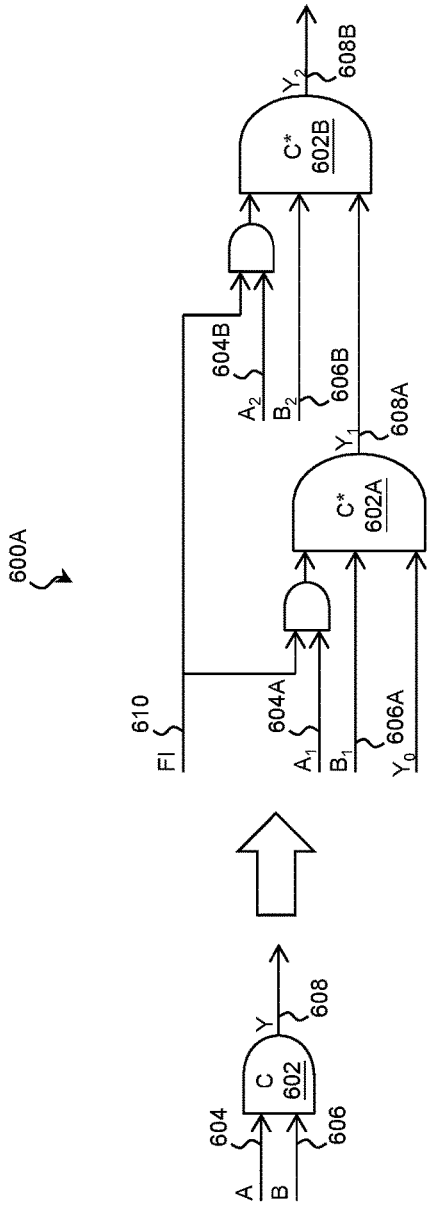
FIG. 6A is a circuit diagram of a model of a scannable element for detecting a first type of stuck-at fault according to various aspects of the present disclosure.
Figure 6B:
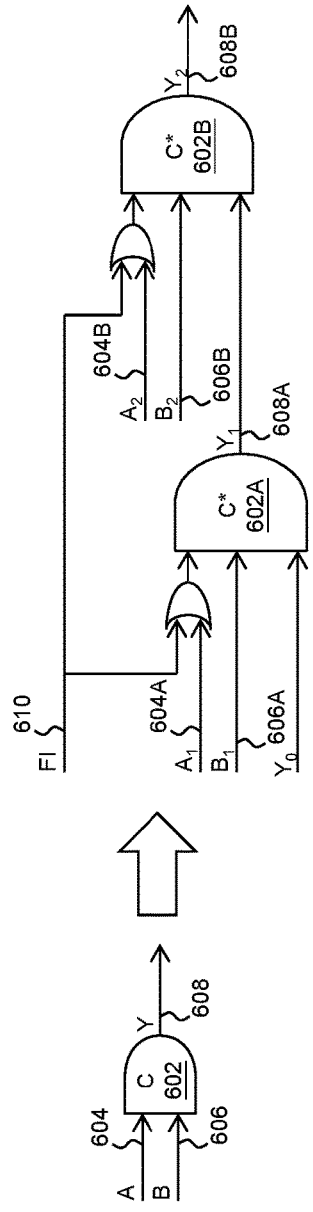
FIG. 6B is a circuit diagram of a model of a scannable element for detecting a second type of stuck-at fault according to various aspects of the present disclosure.

Referring to block 502 of FIG. 5 and to FIGS. 6A and 6B, a scannable storage element 602 of a circuit is identified to model, such as the c-element 202 of the asynchronous scannable element 200 of FIGS. 2-4. The storage element 602 receives a number of inputs (e.g., first input 604 and second input 606) and provides an output 608 that depends in part on the inputs. In some examples where the storage element 602 includes a c-element, the output 608 is equal to the inputs 604 and 606 if the inputs match, and the output 608 retains its last value if the inputs are different. In this way, the storage element 602 is considered to have a feedback loop. For modeling the storage element 602, it may be beneficial to break the feedback loop by instantiating multiple copies of the storage element 602 representing the storage element 602 at different points in time.

Referring to block 504 of FIG. 5 and to FIGS. 6A and 6B, a first instance 602A of the storage element 602 at a first point in time (T1) and a second instance 602B of the storage element 602 at a second point in time (T2) are instantiated in the model. The first instance 602A receives the values of the inputs at the first point in time (designated 604A and 606A), and the second instance 602B receives the values of the inputs at the second point in time (designated 604B and 606B). The storage element instances 602A and 602B also have an additional input that represents the previous state of the storage element 602, and thus, the output 608A of the first instance 602A is provided to an input of the second instance 602B.

Referring to block 506 of FIG. 5 and to FIGS. 6A and 6B, a signal is selected to test for a stuck-at fault. In the illustrated examples, the signal associated with the first input 604 is selected to test. Referring to block 508 of FIG. 5 and to FIGS. 6A and 6B, fault injection logic is instantiated for the selected signal and the selected stuck-at fault. For a stuck-at zero fault, the corresponding inputs 604A at T1 and 604B at T2 may be logically AND'ed with a fault injection input 610 as shown in FIG. 6A. For a stuck-at one fault, the corresponding inputs 604A at T1 and 604B at T2 may be logically OR'ed with the fault injection input 610 as shown in FIG. 6B.

Referring to block 510, the model is used in an Automatic Test Pattern Generation (ATPG) technique to determine a scan pattern that will distinguish when the stuck-at fault occurs. In some examples, the scan pattern produces a transition that indicates such a fault or avoids a transition where avoiding the transition indicates the fault. For example, to detect a stuck-at zero fault at an input (e.g., input 604 of FIG. 6A), the ATPG technique may generate a scan pattern that, when applied to those scannable elements that combine to generate a signal at the input, cause the input in a fault-free circuit to transition from a logical "0" to a logical "1". However, in a circuit with a stuck-at zero fault, the input will remain at logical "0" even though the scan pattern is applied. So that the transition or lack thereof is detectable at an output (e.g., output 608 of FIG. 6A), the scan pattern may also cause other inputs (e.g., input 606) to be in a state where a transition in the input under test (input 604) causes a transition in the output 608. As the inputs are functions of the logic that generate the inputs, the particular scan pattern may depend on the particulars of the circuit in which the scannable element(s) are instantiated.

Some ATPG techniques are able to trace logical functions though combinational logic to determine a scan pattern, but may not be able to compute a scan pattern for circuits with feedback paths. In such examples, modeling a storage element 602 as individual instances at discrete points in time (e.g., storage element 602A and 602B) may, in effect, break the feedback loop and allow the ATPG technique to generate a suitable scan pattern.

Referring to block 512, the scan pattern is loaded into a physical implementation of the circuit, and referring to block 514, a scan test is performed using the scan pattern to determine whether the particular fault is detected at the scannable element. This may be performed substantially as described in the method 400 of FIG. 4 or using any other suitable technique.

Figure 7:
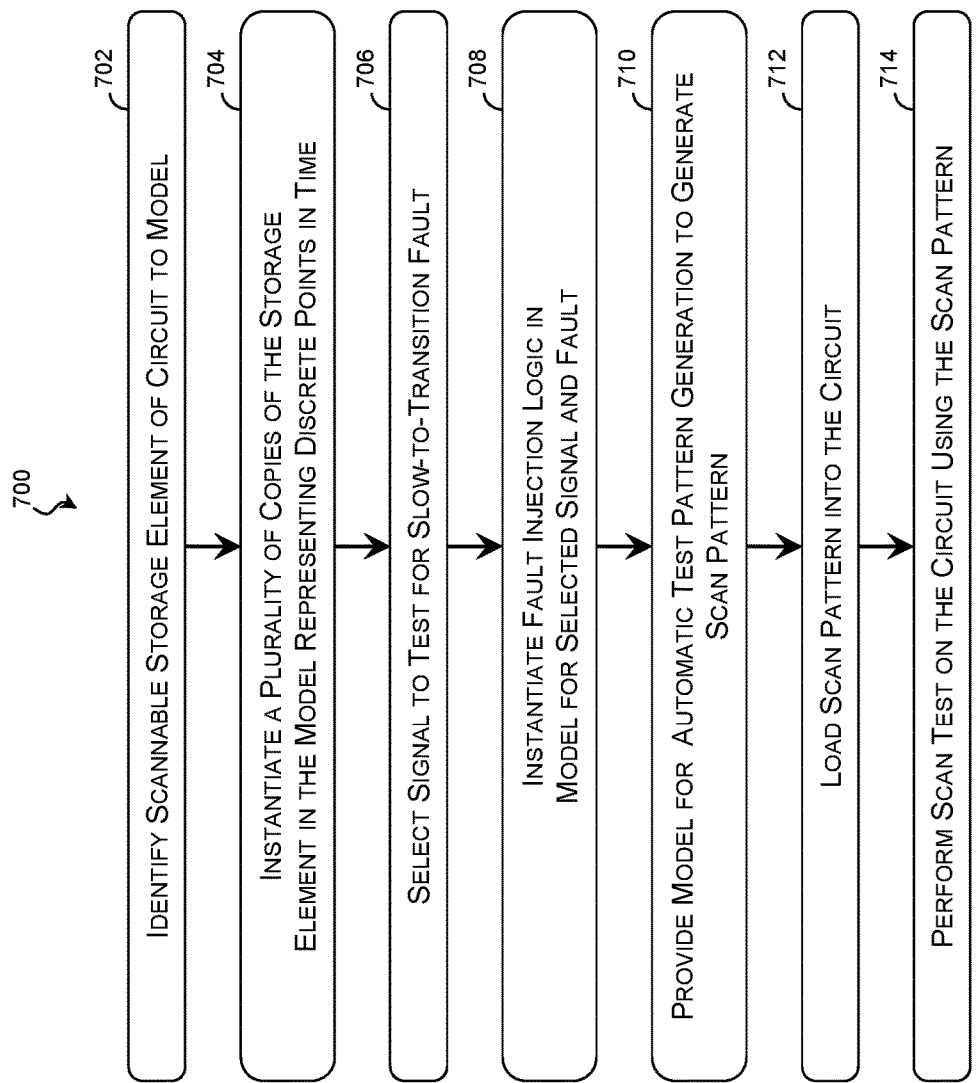
FIG. 7 is a flow diagram of a method of scan pattern generation for detecting slow-to-transition faults according to various aspects of the present disclosure.

Further examples of generating scan patterns are described with reference to FIG. 7 and FIGS. 8A and 8B. In that regard, FIG. 7 is a flow diagram of a method 700 of scan pattern generation for detecting slow-to-transition faults according to various aspects of the present disclosure. Additional steps can be provided before, during, and after the method 700, and some of the steps described can be replaced or eliminated for other embodiments of the method 700. FIG. 8A is a circuit diagram of a model 800A of a scannable element for detecting a first type of slow-to-transition fault according to various aspects of the present disclosure. FIG. 8B is a circuit diagram of a model 800B of a scannable element for detecting a second type of slow-to-transition fault according to various aspects of the present disclosure.

Referring to block 702 of FIG. 7 and to FIGS. 8A and 8B, a scannable storage element 802 is identified to model, such as the c-element 202 of the asynchronous scannable element 200 of FIGS. 2-4. This may be performed substantially as described in block 502 of FIG. 5. The storage element 802 receives a number of inputs (e.g., first input 804 and second input 806) and provides an output 808 that depends in part on the inputs. Referring to block 704 of FIG. 7 and to FIGS. 8A and 8B, a first instance 802A of the storage element 802 at a first point in time (T1), a second instance 802B of the storage element 802 at a second point in time (T2), and a third instance 802C of the storage element 802 at a third point in time (T3) are instantiated in the model. The first instance 802A receives the values of the inputs at the first point in time (designated 804A and 806A) to provide output 808A, the second instance 802B receives the values of the inputs at the second point in time (designated 804B and 806B) to provide output 808B, and the third instance 802C receives the values of the inputs at the third point in time (designated 804C and 806C) to provide output 808C. The storage element instances 802A, 802B, and 802C also have an additional input that represents the previous state of the storage element 602. The output 808A of the first instance 802A is provided to an input of the second instance 802B, and the output 808B of the second instance 802B is provided to an input of the third instance 802C.

Referring to block 706 of FIG. 7 and to FIGS. 8A and 8B, a signal is selected to test for a slow-to-transition fault (e.g., a slow-to-rise or slow-to-fall fault). In the illustrated examples, the signal associated with the first input 804 is selected to test. Referring to block 708 of FIG. 7 and to FIGS. 8A and 8B, fault injection logic is instantiated for the selected signal and the selected slow-to-transition fault.

Referring to FIG. 8A, in an example for a slow-to-fall fault, the corresponding input 804A at T1 is logically AND'ed with a fault injection input 810 and the result is logically OR'ed with the input 804B at T2 and provided to an input of the second instance 802B. The input 804B at T2 is also logically AND'ed with the fault injection input 810 and the result is logically OR'ed with the input 804C at T3 and provided to an input of the third instance 802C. Referring to FIG. 8B, in an example for a slow-to-rise fault, the corresponding input 804A at T1 is logically OR'ed with a fault injection input 810 and the result is logically AND'ed with the input 804B at T2 and provided to an input of the second instance 802B. The input 804B at T2 is also logically OR'ed with the fault injection input 810 and the result is logically AND'ed with the input 804C at T3 and provided to an input of the third instance 802C Referring to block 708, the model is used in an ATPG technique to determine a scan pattern that will distinguish when the slow-to-transition fault occurs. As the inputs 804A, 806A, 804B, 806B, 804C, and 806C are functions of the logic that generate the inputs, the particular scan pattern may depend on the particulars of the circuit in which the scannable element(s) are instantiated. Some ATPG techniques are able to trace logical functions though combinational logic to determine a scan pattern, but may not be able to compute a scan pattern for circuits with feedback paths. In such examples, modeling a storage element 802 as individual instances at discrete points in time (e.g., storage element 802A, 802B, and 802C) may, in effect, break the feedback loop and allow the ATPG technique to generate a suitable scan pattern.

Referring to block 712, the scan pattern is loaded into a physical implementation of the circuit, and referring to block 714, a scan test is performed using the scan pattern to determine whether the particular fault is detected at the scannable element. This may be performed substantially as described in the method 400 of FIG. 4 or using any other suitable technique.

Figure 9:
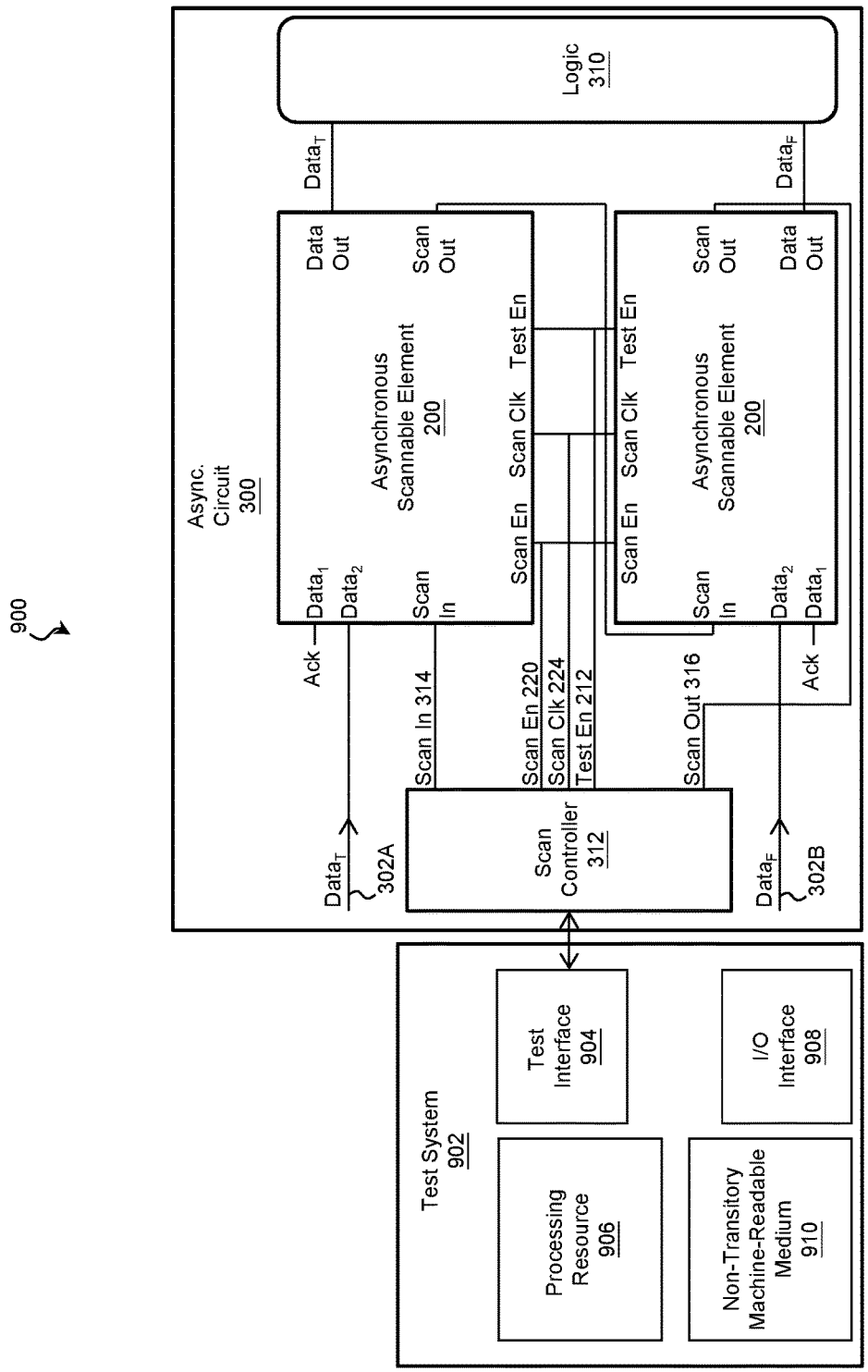
FIG. 9 is a block diagram of a test environment according to various aspects of the present disclosure.

In various embodiments, the technique is performed by using combinations of dedicated, fixed-function computing elements and programmable computing elements executing software instructions. Accordingly, it is understood that any of the steps of method 400, method 500, and/or method 700 may be implemented by a computing system using corresponding instructions stored on or in a non-transitory machine-readable medium accessible by the processing system. Examples of such a system and non-transitory machine-readable medium are described with reference to FIG. 9. In that regard, FIG. 9 is a block diagram of a test environment 900 according to various aspects of the present disclosure.

The test environment 900 includes a test system 902 in communication with a circuit under test, such as the asynchronous circuit 300 described above. The test system 902 is a computing system operable to communicate with the circuit 300 to perform various test functions such as scan testing. Accordingly the test system 902 may include a test interface 904 that sends and receives signals from a scan controller 312 and/or other elements of the circuit 300 to perform the scan testing. The test interface 904 may be under the control of a processing resource 906 that may include any number and type of processing elements such as Central Processing Units (CPUs) Graphical Processing Units (GPUs), Application-Specific Integrated Circuits (ASICs), microcontrollers, and/or other suitable processing elements. The test system 902 may also include an I/O interface 908 for communicating test information and results with a user and/or other computing systems. Accordingly the I/O interface 908 may include controllers for video output (e.g., a GPU), user input (e.g., controllers for a keyboard, a mouse, a pen input device, a touchpad, etc.), network controllers (e.g., Ethernet and/or wireless communication controllers), and/or other suitable I/O controllers.

The processing resource 906 is coupled to a tangible non-transitory machine-readable medium 910 to execute instructions stored on the medium 910. For the purposes of this description, the tangible non-transitory machine-readable medium 910 can be any apparatus that can store the program for use by or in connection with the instruction execution system, apparatus, or device. The medium may include non-volatile memory including magnetic storage, solid-state storage, optical storage, cache memory, and/or battery-backed Random Access Memory (RAM).

In various examples, the tangible non-transitory machine-readable medium 910 stores instructions that cause the processing resource 906 to perform the processes of methods 400, 500, and/or 700. In some such examples, the medium 910 stores instructions that cause the processing resource 906 to assert a test enable 212 and/or a scan enable 220 substantially as described in block 402 of FIG. 4 and to provide a value of a scan pattern to a scannable device substantially as described in block 404. In some such examples, the medium 910 stores instructions that cause the processing resource 906 to pulse a scan clock 224 substantially as described in block 406 and to repeat the providing of a value of the scan pattern and pulsing the scan clock substantially as described in block 408. In some such examples, the medium 910 stores instructions that cause the processing resource 906 to de-assert the scan enable 220 substantially as described in block 410 and to pulse the scan clock 224 to capture a value that represents the response to the scan pattern substantially as described in block 412. In some such examples, the medium 910 stores instructions that cause the processing resource 906 to receive the captured response value from the scan-out output of a scannable device substantially as described in block 414 and to assert the scan enable 220 and pulse the scan clock 224 to shift the values stored in the scan latches substantially as described in block 416. In some such examples, the medium 910 stores instructions that cause the processing resource 906 to repeat the above until each value is read from the devices of a scan chain substantially as described in block 418.

In some examples, the medium 910 stores instructions that cause the processing resource 906 to identify a scannable storage element 602 of a circuit to model substantially as described in block 502 of FIG. 5 and to instantiate a plurality of copies of the storage element 602 substantially as described in block 504. In some such examples, the medium 910 stores instructions that cause the processing resource 906 to select a signal to test for a stuck-at fault substantially as described in block 506 and to instantiate fault injection logic for the selected signal and the selected stuck-at fault substantially as described in block 508. In some such examples, the medium 910 stores instructions that cause the processing resource 906 to use the model in an Automatic Test Pattern Generation (ATPG) technique to determine a scan pattern that will distinguish when the stuck-at fault occurs substantially as described in block 510. In some such examples, the medium 910 stores instructions that cause the processing resource 906 to load the scan pattern into a physical implementation of the circuit substantially as described in block 512 and to perform the scan test on the circuit using the scan pattern substantially as described in block 514.

In some examples, the medium 910 stores instructions that cause the processing resource 906 to identify a scannable storage element 802 of a circuit to model substantially as described in block 702 of FIG. 7 and to instantiate a plurality of copies of the storage element 802 substantially as described in block 704. In some such examples, the medium 910 stores instructions that cause the processing resource 906 to select a signal to test for a slow-to-transition fault substantially as described in block 706 and to instantiate fault injection logic for the selected signal and the selected slow-to-transition fault substantially as described in block 708. In some such examples, the medium 910 stores instructions that cause the processing resource 906 to use the model in an Automatic Test Pattern Generation (ATPG) technique to determine a scan pattern that will distinguish when the stuck-at fault occurs substantially as described in block 710. In some such examples, the medium 910 stores instructions that cause the processing resource 906 to load the scan pattern into a physical implementation of the circuit substantially as described in block 712 and to perform the scan test on the circuit using the scan pattern substantially as described in block 714.

Thus, the present disclosure provides examples of a circuit with DFT elements and a method for utilizing the elements to perform a scan test. In some examples, a circuit includes a data input coupled to a scan multiplexer and a path select multiplexer; and a scan-in input coupled to the scan multiplexer, wherein the scan-in input is to receive a value of a scan pattern; and a scan latch to store the value and having an input coupled to the scan multiplexer and an output coupled to the path select multiplexer, wherein: the scan multiplexer is to select a first signal from a group consisting of the data input and the scan-in input and to provide the first signal to the input of the scan latch; and the path select multiplexer is to select a second signal from a group consisting of the data input and the output of the scan latch and to provide the second signal to a data output of the circuit. In one such example, wherein the path select multiplexer includes an asynchronous hazard-handling multiplexer. In one such example, the circuit further includes a scan-out output coupled to the output of the scan latch. In one such example, the scan-out output is to couple to a scan-in input of a subsequent scannable element in a scan chain. In one such example, the data input is a first data input, and the circuit further includes: a c-element coupled between the first data input and the path select multiplexer; and a second data input coupled to the c-element. In one such example, the first data input is coupled to receive a signal of a dual-rail signal pair and the second data input is coupled to receive an Ack signal from a downstream element coupled to the data output of the circuit. In one such example, the circuit further includes a scan inhibitor coupled between the output of the scan latch and the path select multiplexer, wherein the scan inhibitor is to inhibit the output of the scan latch while the value is being stored in the scan latch. In one such example, the circuit further includes a scan enable coupled to the scan multiplexer to cause the multiplexer to select the first signal from the group consisting of the data input and the scan-in input and coupled to the scan inhibitor to cause the scan inhibitor to inhibit the output of the scan latch.

In further examples, a circuit includes a c-element to receive a first data signal and a second data signal, wherein the c-element is to store a value when the first data signal and the second data signal both match the value and to retain a previous value when the first data signal and the second data signal do not match; and a path select multiplexer coupled to the c-element to select between an output of the c-element and a scan value to provide at an output of the circuit. In one such example, the path select multiplexer further includes an asynchronous hazard-handling multiplexer. In one such example, the first data signal includes an Ack signal from a downstream element and the second data signal includes a signal of a dual-rail signal pair. In one such example, the circuit further includes a scan multiplexer coupled to receive the second data signal and the scan value and to select between the second data signal and the scan value to provide to a scan latch. In one such example, the scan latch is coupled to the path select multiplexer by a scan inhibitor that is to inhibit the scan value from propagating to the path select multiplexer while the scan latch is being loaded. In one such example, the circuit further includes a scan enable coupled to the scan multiplexer to cause the scan multiplexer to select between the second data signal and the scan value and coupled to the scan inhibitor to cause the scan inhibitor to inhibit the scan value from propagating to the path select multiplexer. In one such example, the circuit further includes a scan-out output to provide an output of the scan latch. In one such example, the scan-out output is to provide the output of the scan latch to another scan latch in a scan chain.

In yet further examples, a non-transitory machine-readable medium stores instructions that, when executed by a processing resource, cause the processing resource to: identify a scannable storage element to model; instantiate a plurality of copies of the scannable storage element each representing a point in time in a model of a circuit; instantiate, in the model, fault injection logic to inject a fault; and use the model in an automatic test pattern generation technique to determine a scan pattern to test for the fault. In one such example, the non-transitory machine-readable medium stores further instructions that cause the processing resource to: load the scan pattern into a physical implementation of the circuit; and perform a scan test on the physical implementation of the circuit using the scan pattern to detect the fault. In one such example, the fault is from a group consisting of a stuck-at "0" fault and a stuck-at "1" fault. In one such example, the fault includes a slow-to-transition fault.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a data input coupled to a scan multiplexer and a path select multiplexer;
   a scan-in input coupled to the scan multiplexer, wherein the scan-in input is to receive a value of a scan pattern;
   a scan latch to store the value and having an input coupled to the scan multiplexer and an output coupled to the path select multiplexer, wherein:
   the scan multiplexer is to select a first signal from a group consisting of the data input and the scan-in input and to provide the first signal to the input of the scan latch; and
   the path select multiplexer is to select a second signal from a group consisting of the data input and the output of the scan latch and to provide the second signal to a data output of the circuit; and
   a scan inhibitor coupled between the output of the scan latch and the path select multiplexer, wherein the scan inhibitor is to inhibit the output of the scan latch while the value is being stored in the scan latch.

2. The circuit of claim 1, wherein the path select multiplexer includes an asynchronous hazard-handling multiplexer.

3. The circuit of claim 1 further comprising a scan-out output coupled to the output of the scan latch.

4. The circuit of claim 3, wherein the scan-out output is to couple to a scan-in input of a subsequent scannable element in a scan chain.

5. The circuit of claim 1, wherein the data input is a first data input, the circuit further comprising:
   a c-element coupled between the first data input and the path select multiplexer; and
   a second data input coupled to the c-element.

6. The circuit of claim 5, wherein the first data input is coupled to receive a signal of a dual-rail signal pair and the second data input is coupled to receive an Ack signal from a downstream element coupled to the data output of the circuit.

7. The circuit of claim 1, further comprising a scan enable coupled to the scan multiplexer to cause the multiplexer to select the first signal from the group consisting of the data input and the scan-in input and coupled to the scan inhibitor to cause the scan inhibitor to inhibit the output of the scan latch.

8. The circuit of claim 1, wherein the path select multiplexer is a synchronous multiplexer.

9. The circuit of claim 1, further comprising a scan clock, wherein the value is stored by the scan latch when the scan clock is pulsed.

10. A circuit comprising:
    a c-element to receive a first data signal and a second data signal, wherein the c-element is to store a value when the first data signal and the second data signal both match the value and to retain a previous value when the first data signal and the second data signal do not match; and
    a path select multiplexer coupled to the c-element to select between an output of the c-element and a scan value to provide at an output of the circuit,
    a scan multiplexer coupled to receive the second data signal and the scan value and to select between the second data signal and the scan value to provide to a scan latch, wherein the scan latch is coupled to the path select multiplexer by a scan inhibitor that is to inhibit the scan value from propagating to the path select multiplexer while the scan latch is being loaded.

11. The circuit of claim 10, wherein the path select multiplexer includes an asynchronous hazard-handling multiplexer.

12. The circuit of claim 10, wherein the first data signal includes an Ack signal from a downstream element and the second data signal includes a signal of a dual-rail signal pair.

13. The circuit of claim 10, further comprising a scan enable coupled to the scan multiplexer to cause the scan multiplexer to select between the second data signal and the scan value and coupled to the scan inhibitor to cause the scan inhibitor to inhibit the scan value from propagating to the path select multiplexer.

14. The circuit of claim 10, further comprising a scan-out output to provide an output of the scan latch.

15. The circuit of claim 14, wherein the scan-out output is to provide the output of the scan latch to another scan latch in a scan chain.

16. The circuit of claim 10, further comprising a scan-in input coupled to the scan multiplexer, wherein the scan-in input is to receive the scan value.

17. A non-transitory machine-readable medium storing instructions that, when executed by a processing resource, cause the processing resource to:
    identify a scannable storage element to model;
    implement a plurality of copies of the scannable storage element each representing a point in time in a model of a circuit;
    implement, in the model, fault injection logic to inject a fault;
    use the model in an automatic test pattern generation technique to determine a scan pattern to test for the fault,
    load the scan pattern into a physical implementation of the circuit; and
    perform a scan test on the physical implementation of the circuit using the scan pattern to detect the fault.

18. The non-transitory machine-readable medium of claim 17, wherein the fault is from a group consisting of a stuck-at "0" fault and a stuck-at "1" fault.

19. The non-transitory machine-readable medium of claim 17, wherein the fault includes a slow-to-transition fault.

20. The non-transitory machine-readable medium of claim 17, wherein the scan pattern is selected from the group consisting of a first scan pattern and a second scan pattern,
    wherein the first scan pattern produces a first transition that indicates the fault, and
    wherein the second scan pattern avoids a second transition such that avoiding the second transition indicates the fault.

* * * * *